(12) United States Patent
Johnston et al.

(10) Patent No.: US 9,315,900 B2
(45) Date of Patent: Apr. 19, 2016

(54) ISOLATION OF MICROWAVE SOURCES THROUGH BELLOWS

(71) Applicant: Applied Materials, Inc., Santa Clara, CA (US)

(72) Inventors: Benjamin M. Johnston, Los Gatos, CA (US); Shinichi Kurita, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 163 days.

(21) Appl. No.: 14/371,415

(22) PCT Filed: Jan. 11, 2013

(86) PCT No.: PCT/US2013/021251
§ 371 (c)(1),
(2) Date: Jul. 9, 2014

(87) PCT Pub. No.: WO2013/112303
PCT Pub. Date: Aug. 1, 2013

(65) Prior Publication Data
US 2015/0002019 A1    Jan. 1, 2015

Related U.S. Application Data

(60) Provisional application No. 61/591,738, filed on Jan. 27, 2012.

(51) Int. Cl.
| | | |
|---|---|---|
| C23C 16/00 | (2006.01) |
| C23C 16/511 | (2006.01) |
| C23C 16/44 | (2006.01) |
| H01J 37/32 | (2006.01) |

(52) U.S. Cl.
CPC .......... *C23C 16/511* (2013.01); *C23C 16/4409* (2013.01); *H01J 37/3222* (2013.01); *H01J 37/32513* (2013.01)

(58) Field of Classification Search
CPC .......................... C23C 16/511; C23C 16/4409
USPC ................... 118/723 MW, 723 AN, 728, 733
See application file for complete search history.

(56) References Cited

U.S. PATENT DOCUMENTS

| | | | |
|---|---|---|---|
| 4,911,103 A | * | 3/1990 | Davis ...................... C23C 16/54 118/715 |
| 7,252,737 B2 | | 8/2007 | Brown et al. |

(Continued)

FOREIGN PATENT DOCUMENTS

| | | |
|---|---|---|
| KR | 20-0409518 Y1 | 3/2006 |
| WO | 2007-106660 A2 | 9/2007 |
| WO | 2009-085708 A1 | 7/2009 |

OTHER PUBLICATIONS

International Search Report and Written Opinion dated Jun. 14, 2013 for PCT/US2013/021251.

*Primary Examiner* — Thuy Vinh Tran
(74) *Attorney, Agent, or Firm* — Patterson & Sheridan, LLP

(57) ABSTRACT

A bellows which forms a flexible coupling between the lid of a processing chamber and an antenna feed through. One embodiment provides an apparatus comprising a chamber body having a chamber lid, a feed through extending through the chamber lid, an antenna coupled to and extending through the feed through to an internal volume of the chamber body, and a bellows comprising a first flange, the first flange coupled to the feed through, a second flange, the second flange coupled to the chamber lid, and a center portion extending between the first flange and the second flange.

20 Claims, 9 Drawing Sheets

(56) References Cited

U.S. PATENT DOCUMENTS

| | | | | |
|---|---|---|---|---|
| 2001/0045262 A1* | 11/2001 | Gujer | ............... | C23C 16/4401 156/345.51 |
| 2003/0101938 A1* | 6/2003 | Ronsse | ............... | C23C 16/407 118/726 |
| 2006/0225656 A1 | 10/2006 | Horiguchi | | |
| 2010/0294199 A1* | 11/2010 | Tran | ............... | C23C 16/4401 118/723 R |

* cited by examiner

US 9,315,900 B2

ISOLATION OF MICROWAVE SOURCES THROUGH BELLOWS

BACKGROUND OF THE INVENTION

1. Field of the Invention

Embodiments of the present invention generally relate to a flexible coupling for use in a plasma enhanced chemical vapor deposition (PECVD) apparatus.

2. Description of the Related Art

Chemical vapor deposition (CVD) is a process whereby chemical precursors are introduced into a processing chamber, chemically react to form a predetermined compound or material, and deposit the compound or material onto a substrate within the processing chamber. Plasma enhanced chemical vapor deposition (PECVD) is a process whereby a plasma is ignited in the chamber to enhance the reaction between the precursors.

The PECVD process may be used to process large area substrates, such as flat panel displays or solar panels. PECVD may also be used to deposit layers such as silicon based films for transistors. During the processing of large area substrates, the walls of the chamber may undergo thermal and/or vacuum deformation. For example, vacuum forces may cause the walls of the processing chamber to deflect up to 1 centimeter. In conventional systems, the antenna feed through is coupled directly to the chamber lid, and the feed through forms a tight connection with a dielectric layer of the microwave antenna. As a result, deflection of the chamber lid may be translated from the feed through to the antenna, creating a torque on the dielectric layer and causing breakage. Therefore, there is a need in the art to isolate the antenna and dielectric layer from deflection of the chamber lid.

SUMMARY OF THE INVENTION

The present invention generally comprises a bellows which forms a flexible vacuum seal between the lid of a processing chamber and an antenna feed through. In one aspect, an apparatus comprises a chamber body having a chamber lid, a feed through extending through the chamber lid, an antenna coupled to and extending through the feed through to an internal volume of the chamber body, and a bellows comprising a first flange, the first flange coupled to the feed through, a second flange, the second flange coupled to the chamber lid, and a center portion extending between the first flange and the second flange.

In another aspect, an apparatus comprises a chamber body having a chamber lid, a feed through extending through the chamber lid, an antenna coupled to and extending through the feed through to an internal volume of the chamber body, and a bellows comprising a first flange, the first flange coupled to the feed through, a second flange, the second flange coupled to the chamber lid, and a center portion extending between the first flange and the second flange, wherein the feed through is not coupled directly to the chamber lid, and the bellows forms a vacuum seal between the feed through and the chamber lid.

In another aspect, an apparatus comprises a chamber body having a chamber lid, a feed through extending through the chamber lid, an antenna coupled to and extending through the feed through to an internal volume of the chamber body, and a bellows comprising a first flange, the first flange coupled to the feed through, a second flange, the second flange coupled to the chamber lid, and a center portion extending between the first flange and the second flange, wherein the center portion comprises a flexible region adapted to expand in response a tensile force between the first and second flanges and contract in response to a compressive force between the first and second flanges.

In another aspect, an apparatus comprises a chamber body having a chamber lid, a feed through extending through the chamber lid, an antenna coupled to and extending through the feed through to an internal volume of the chamber body, a bellows comprising a first flange, the first flange coupled to the feed through, a second flange, the second flange coupled to the chamber lid, and a center portion extending between the first flange and the second flange, a support framework coupled to the chamber body, and a microwave power head coupled to the support framework, the feed through being coupled to the microwave power head.

In another aspect, a method for isolating an antenna comprises providing a chamber body having a chamber lid, coupling a bellows to the chamber body, coupling a feed through to the bellows, disposing an antenna in the feed through, and evacuating the chamber body to form a vacuum condition in the chamber, wherein the chamber lid undergoes a deflection in response to the evacuating, and the bellows reduces the degree to which the deflection of the chamber lid is translated to the feed through and the antenna.

In yet another aspect, a method for isolating an antenna comprises providing a chamber body having a chamber lid, providing a bellows having a center portion which comprises a flexible region adapted to expand in response a tensile force between a first flange and a second flange of the bellows and contract in response to a compressive force between the first flange and the second flange of the bellows, coupling the bellows to the chamber body, coupling a feed through to the bellows, disposing an antenna in the feed through, and evacuating the chamber body to form a vacuum condition in the chamber, wherein the chamber lid undergoes a deflection in response to the evacuating, and the bellows reduces the degree to which the deflection of the chamber lid is translated to the feed through and the antenna.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally comprises a bellows which forms a flexible vacuum seal between the lid of a processing chamber and an antenna feed through. During substrate processing, deflection of the chamber lid caused by vacuum forces and/or thermal expansion may be translated to the antenna feed through. Due to the tight connection between the feed through and the dielectric layer of the antenna, this deflection may compress and/or torque the dielectric layer, causing breakage. By coupling the antenna feed through to the chamber lid through a flexible bellows, antenna components are isolated from the deflection of the chamber lid. Additionally, the microwave launcher assembly, through which the antenna travels, may be coupled to a support framework which is slidably connected to the chamber body on either side of the chamber lid, further isolating antenna components from deflection of the lid. By isolating antenna components from deflection of the chamber lid, the incidence of dielectric layer breakage is reduced, decreasing operational costs and chamber downtime.

While the particular apparatus within which the embodiments described herein can be practiced is not limited, it is particularly beneficial to practice the embodiments in a vertical CVD chamber, such as those available from Applied Materials, Inc., Santa Clara, Calif. It is to be understood that the embodiments may be practiced in other systems as well, including those sold by other manufacturers.

Figure 1:
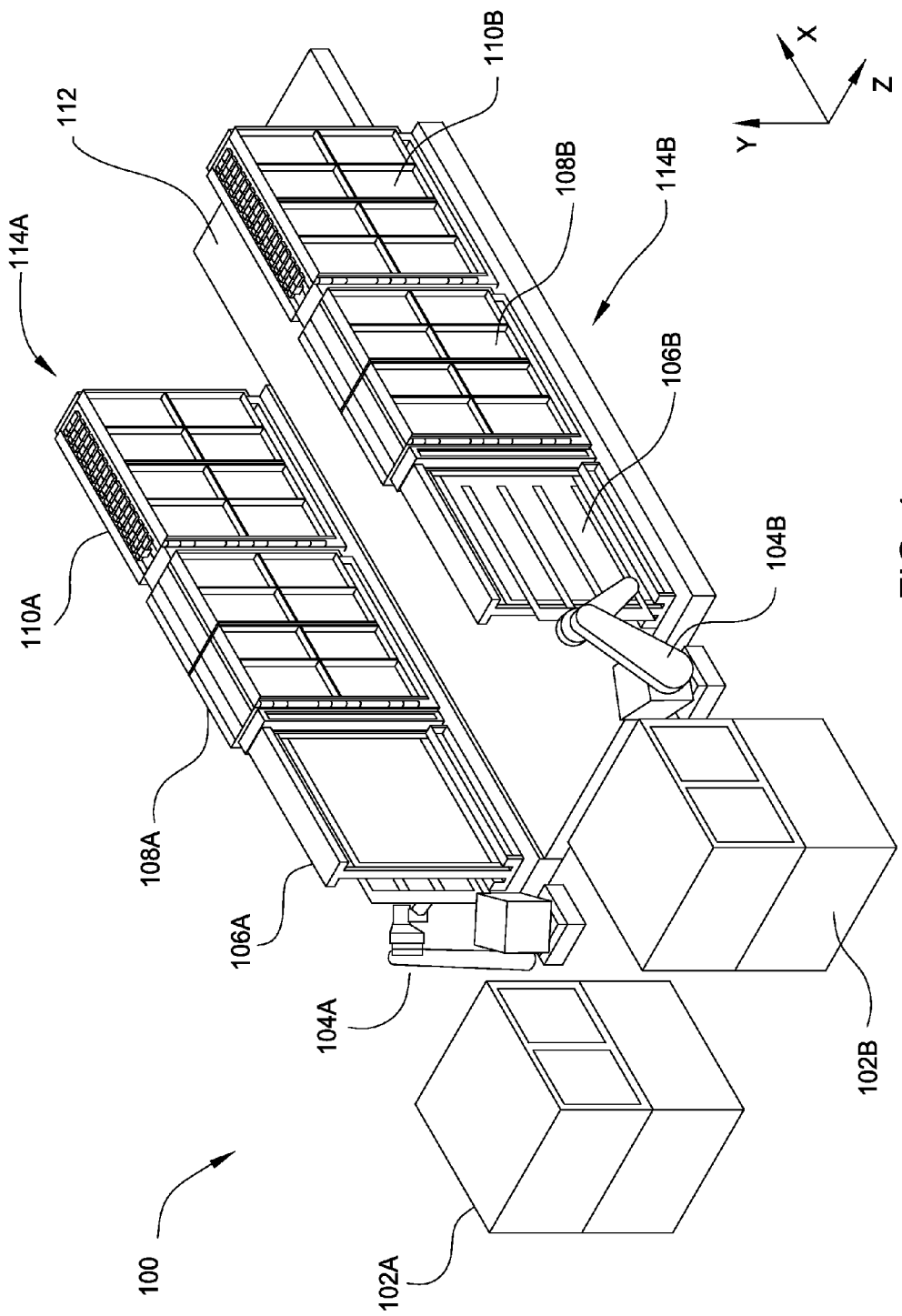
FIG. 1 is a schematic view of a vertical, linear CVD system 100 according to one embodiment.

FIG. 1 is a schematic view of a vertical, linear CVD system 100 according to one embodiment. The system 100 preferably includes two separate process lines 114A, 114B coupled together by a common system control platform 112 to form a twin process line configuration/layout. A common power supply (such as an AC power supply), common and/or shared pumping and exhaust components and a common gas panel may be used for the twin process lines 114A, 114B. It is also contemplated that the system may be configured using a single process line or more than two process lines.

Each processing line 114A, 114B includes a substrate stacking module 102A, 102B from which fresh substrates—substrates which have not yet been processed within the system 100—are retrieved and processed substrates are stored. Atmospheric robots 104A, 104B retrieve substrates from the substrate stacking modules 102A, 102B and place the substrates into a dual substrate loading station 106A, 106B. The fresh substrates are then moved into dual substrate load lock chambers 108A, 108B and then to a dual substrate processing chamber 110A, 110B. Each processed substrate returns through one of the dual substrate load lock chambers 108A, 108B to one of the dual substrate loading stations 106A, 106B, where it is retrieved by one of the atmospheric robots 104A, 104B and returned to one of the substrate stacking modules 102A, 102B.

Figure 2A:
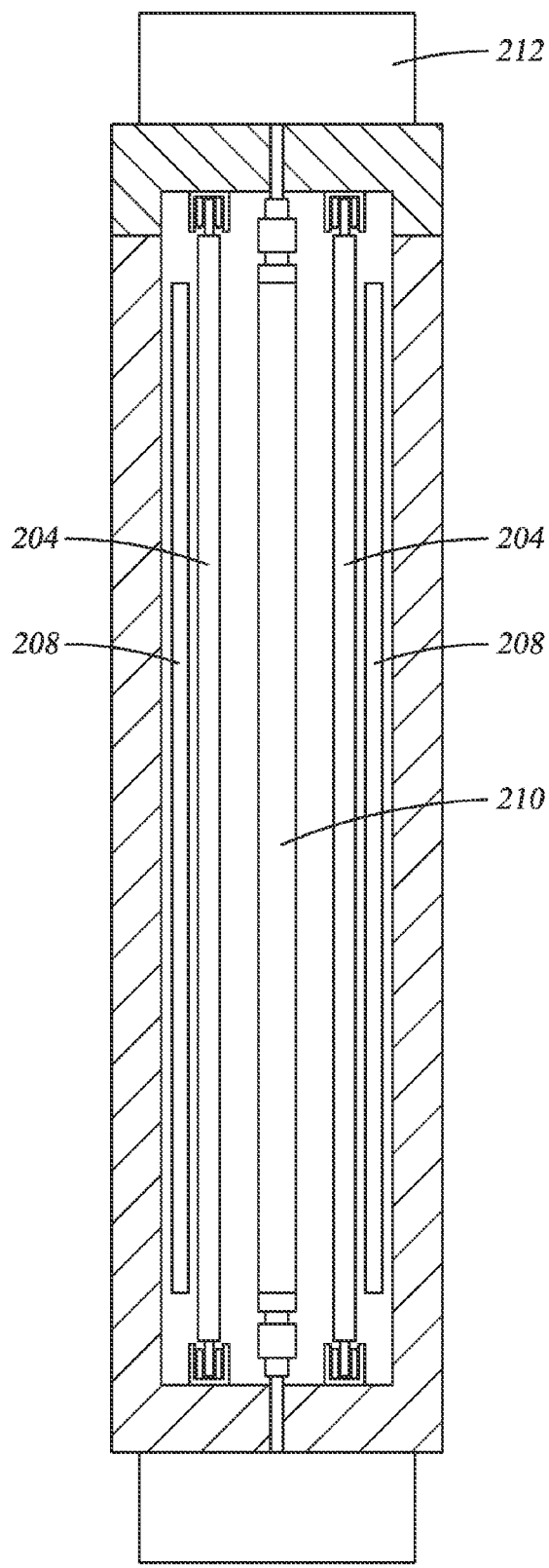
FIG. 2A is a schematic elevation view of dual processing chambers 110A, 110B according to one embodiment.

FIG. 2A is a schematic elevation view of dual processing chambers 110A, 110B according to one embodiment. The dual processing chambers 110A, 110B include a plurality of antennas 210 disposed in a linear arrangement in the center of each processing chamber 110A, 110B. The antennas 210 extend vertically from a top of the processing chamber to a bottom of the processing chamber. Each antenna 210 has a corresponding microwave power head 212 at both the top and the bottom of the processing chamber that is coupled to the antenna 210.

Figure 2B:
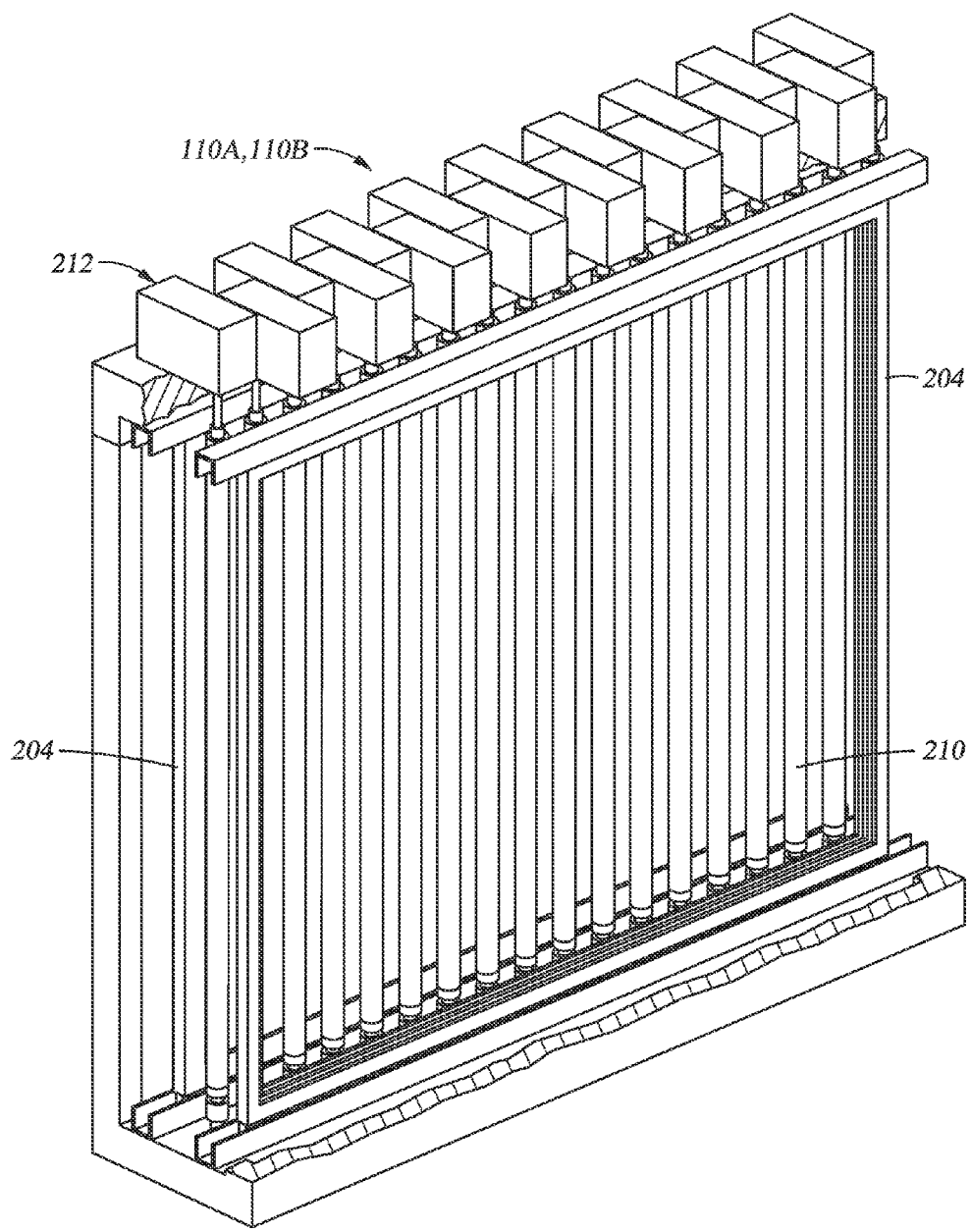
FIG. 2B is a schematic perspective view of dual processing chambers 110A, 110B according to one embodiment.

FIG. 2B is a schematic perspective view of dual processing chambers 110A, 110B according to one embodiment. The dual processing chambers 110A, 110B include a shadow frame 204, a plurality of antennas 210, and a plurality of microwave power heads 212. As shown in FIG. 2B, the microwave power heads 212 are staggered. The staggering may be due to space limitations. Power may be independently applied to each end of the antenna 210 through each power head 212. The antennas 210 may operate at a frequency within a range of about 300 MHz to 300 GHz.

Figure 2C:
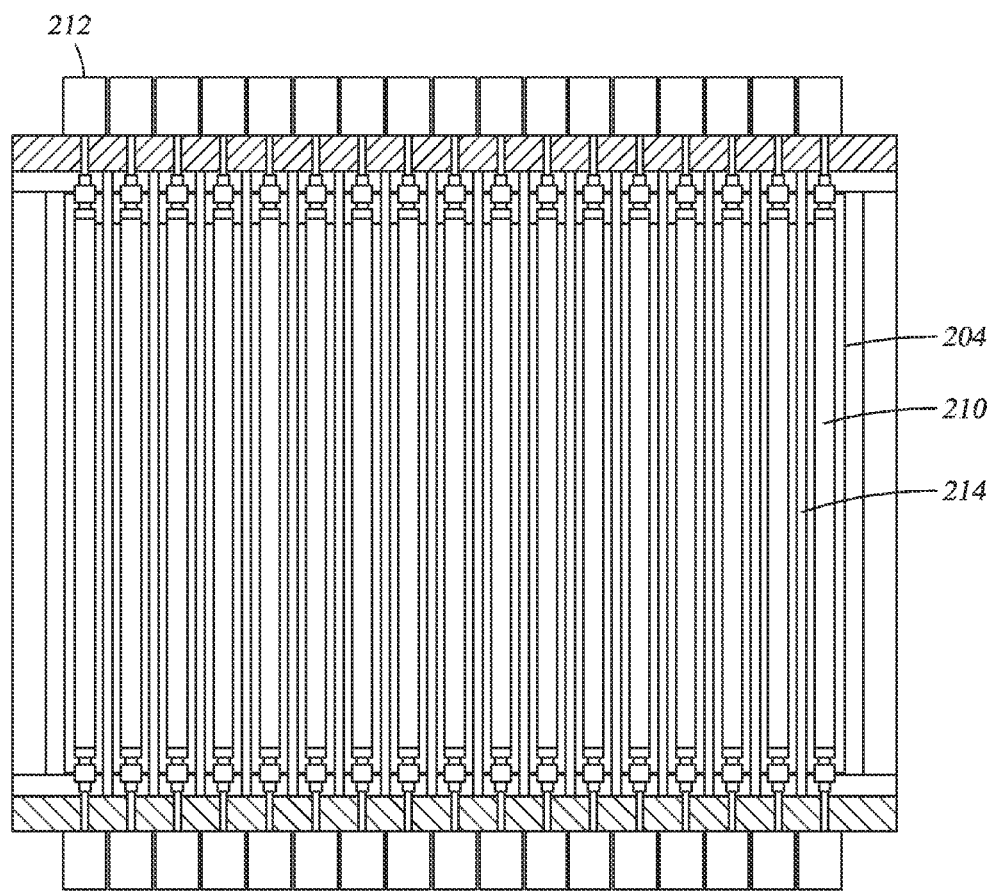
FIG. 2C is a schematic elevation view of dual processing chambers 110A, 110B according to one embodiment.

FIG. 2C is a schematic elevation view of dual processing chambers 110A, 110B according to one embodiment. The dual processing chambers 110A, 110B include a shadow frame 204, a plurality of antennas 210, a plurality of microwave power heads 212, and a plurality of gas introduction tubes 214. The gas introduction tubes 214 are disposed between adjacent antennas 210 and permit the introduction of processing gases, such as silicon precursors and nitrogen precursors. The gas introduction tubes 214 extend vertically from the bottom to the top of the processing chamber and are parallel to the antennas 210.

Figure 2D:
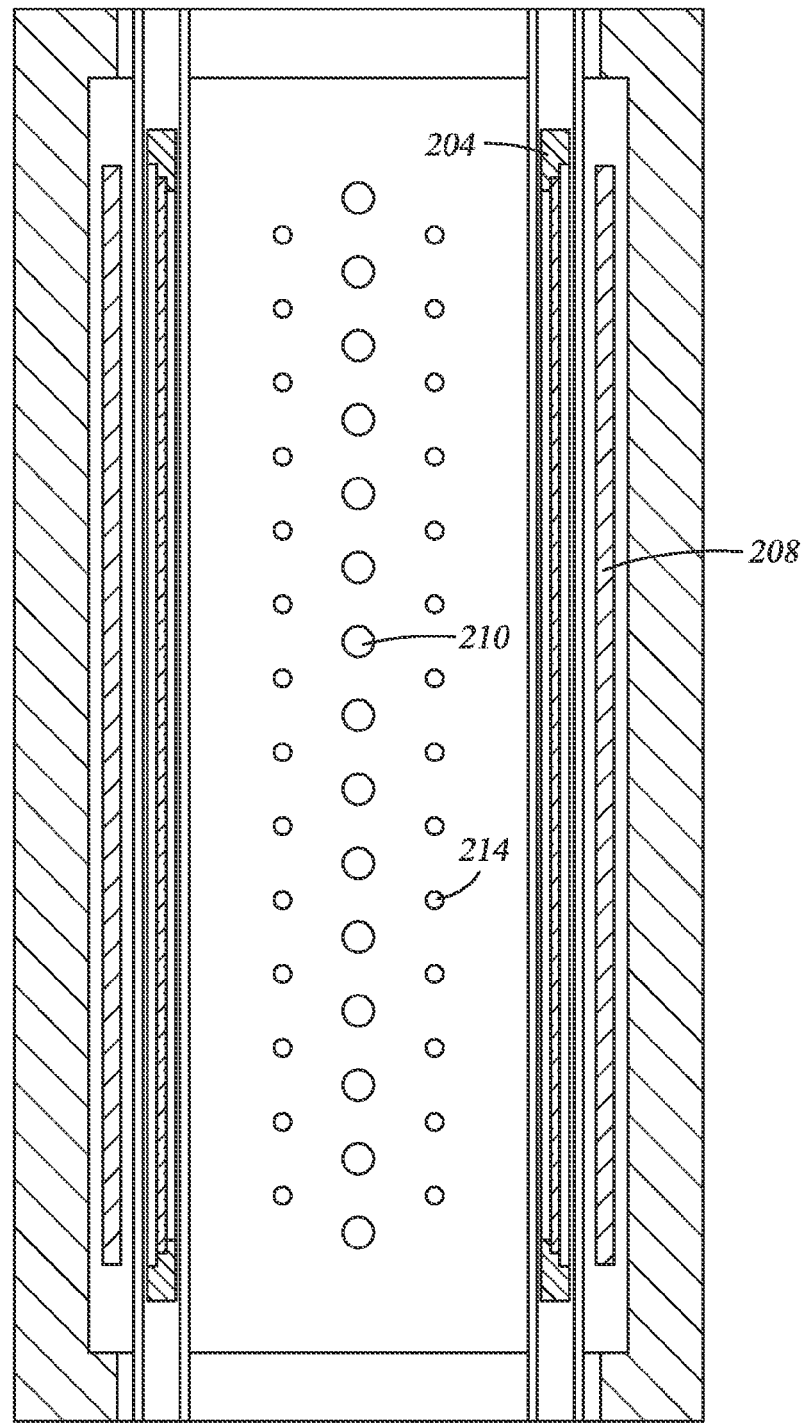
FIG. 2D is a top view of dual processing chambers 110A, 110B according to one embodiment.

FIG. 2D is a top view of dual processing chambers 110A, 110B according to one embodiment. FIG. 2D shows the layout of the antennas 210, gas introduction tubes 214, shadow frames 204, and platens 208 within the processing chamber 110A, 110B. The antennas 210 are centrally located within the processing chamber 110A, 110B. The platens 208 and shadow frames 204 are disposed on opposite sides of the antennas 210. The gas introduction tubes 214 are disposed between the antennas 210 and the shadow frames 204. The number of gas introduction tubes 214 present on each side of the centrally located antennas 210 is equal. Each of the gas introduction tubes 214 has a diameter that is between about 0.25 inches and about 0.625 inches. Each of the processing chambers is capable of processing two substrates, one on each side of the antennas 210. The substrates are held in place within the processing chamber by a platen 208 and a shadow frame 204. While not shown in FIGS. 2A-2D, the processing chambers 110A, 110B may be evacuated through a pumping port located behind the substrate carriers.

Figure 3A:
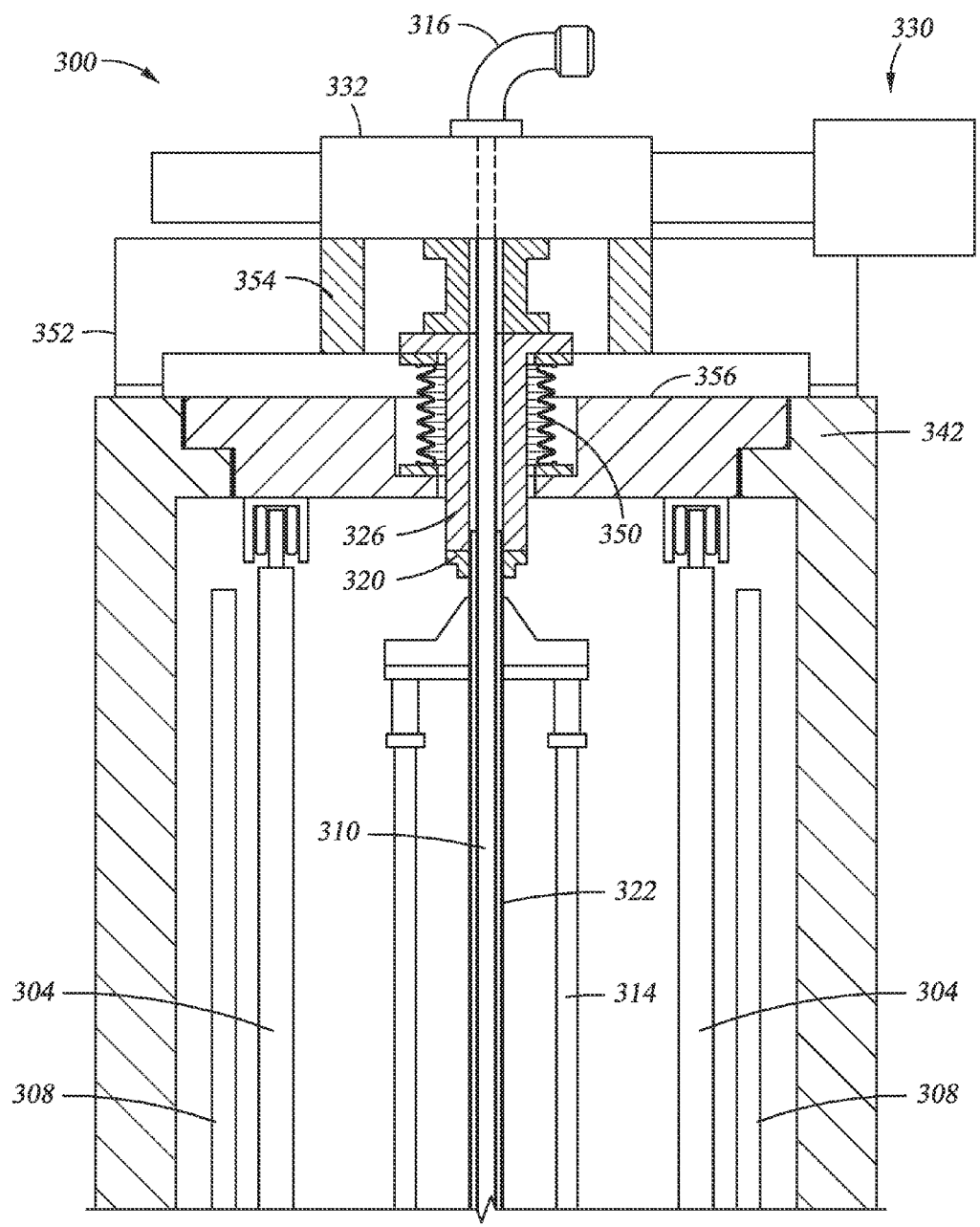
FIG. 3A is a schematic cross-sectional view of an upper portion of a dual processing chamber 300 according to one embodiment.

FIG. 3A is a schematic cross-sectional view of an upper portion of a dual processing chamber 300 according to one embodiment. The dual processing chamber 300 includes shadow frames 304, platens 308, a plurality of antennas 310, a plurality of gas introduction tubes 314, a microwave launcher assembly 330, a bellows 350, a support framework 352, and a chamber lid 356. The microwave launcher assembly 330 includes a microwave power head 332, a feed through 326, and an end cap 320. A fitting 316 is in fluid connection with each antenna 310.

The microwave launcher assembly 330 is coupled to and supported by a support framework 352 which is coupled to a top portion of the processing chamber 342 on either side of the chamber lid 356. By coupling the support framework 352 on either side of the chamber lid 356, the support framework 352 is isolated from deflection of the chamber lid 356. Consequently, the microwave power head 332, coupled to the support framework 352, and the feed through 326, coupled to the microwave power head 332, are also isolated from deflection of the chamber lid 356. An upper end of each antenna 310 extends through the microwave launcher assembly 330, and the end cap 320 of the microwave launcher assembly 330 forms a vacuum seal between the feed through 326 and the dielectric layer 322 disposed around the antenna 310. Thus, the microwave launcher assembly 330, antenna 310, and dielectric layer 322 are isolated from movement of the chamber lid 356.

The microwave launcher assembly 330 may be coupled to one or more of a plurality of support beams 354 of the support framework 352. The support beams 354 may form a gap through which the antenna 310, feed through 326, and bellows 350 may pass, such that the support framework 352 is not directly in contact with the antenna 310, feed through 326, and bellows 350. Each end of a support framework 352 may be coupled to the top of the processing chamber 342, or one or both ends of a support framework 352 may be slidably connected to the top of the processing chamber 342. Providing a sliding connection between the support framework 352 and the processing chamber 300 may further decouple and isolate the microwave launcher assembly 330, antenna 310, and dielectric layer 322 from up, down, left, or right movement of the processing chamber 300.

In one embodiment, one end of the support framework 352 is coupled to the top of the processing chamber 342, and another end of the support framework 352 is slidably connected to a slot formed on the top of the processing chamber 342. The slot may include a recess disposed in the top of the processing chamber 300 in which the base of the support framework 352 sits. The slot may allow for movement of one end of the support framework 352 with respect to the top of the processing chamber 342, reducing stress on the feed through 326 and dielectric layer 322. The slot may form a geometric shape, such as a rectangle. In one embodiment, the slot may be shaped to fit a portion of the base of the support framework 352 which resides on or below the processing chamber 300. In another embodiment, the slot includes one or more brackets which are disposed on the top of the processing chamber 300 and which guide the movement of one or more sections of the base of the support framework 352.

In order to maintain a vacuum seal between the feed through 326 of the microwave launcher assembly 330 and the chamber lid 356 without translating deflection of the chamber lid 356 to the microwave launcher assembly 330, antenna 310, and dielectric layer 322, the feed through 326 is coupled to the chamber lid 356 through a bellows 350. The bellows 350 may include two flanges and a flexible, cylindrical center portion which is capable of expanding or contracting in response to tensile or compressive forces between the flanges. The center portion of the bellows 350 may include an accordion-like design. Each bellows 350 may be disposed in a recess formed in the top of the processing chamber 342. A lower end of the bellows 350 may form a vacuum seal with the processing chamber 300, and an upper end of the bellows 350 may form a vacuum seal with the feed through 326. In one embodiment, the bellows 350 may be bolted to the processing chamber 300 and to the feed through 326, utilizing one or more gaskets to ensure a vacuum seal.

By coupling the feed through 326 to the processing chamber 300 through a bellows 350, the degree to which vacuum and/or thermal deformation of the chamber walls is translated to the feed through 326 is reduced, providing isolation of the antenna 310 from deflection and reducing the incidence of breakage of the dielectric layer 322. Additionally, the inner diameter of the bellows 350 may be greater than the outer diameter of the feed through 326, enabling the bellows 350 to deflect without translating the deflection of the feed through 326.

Figure 3B:
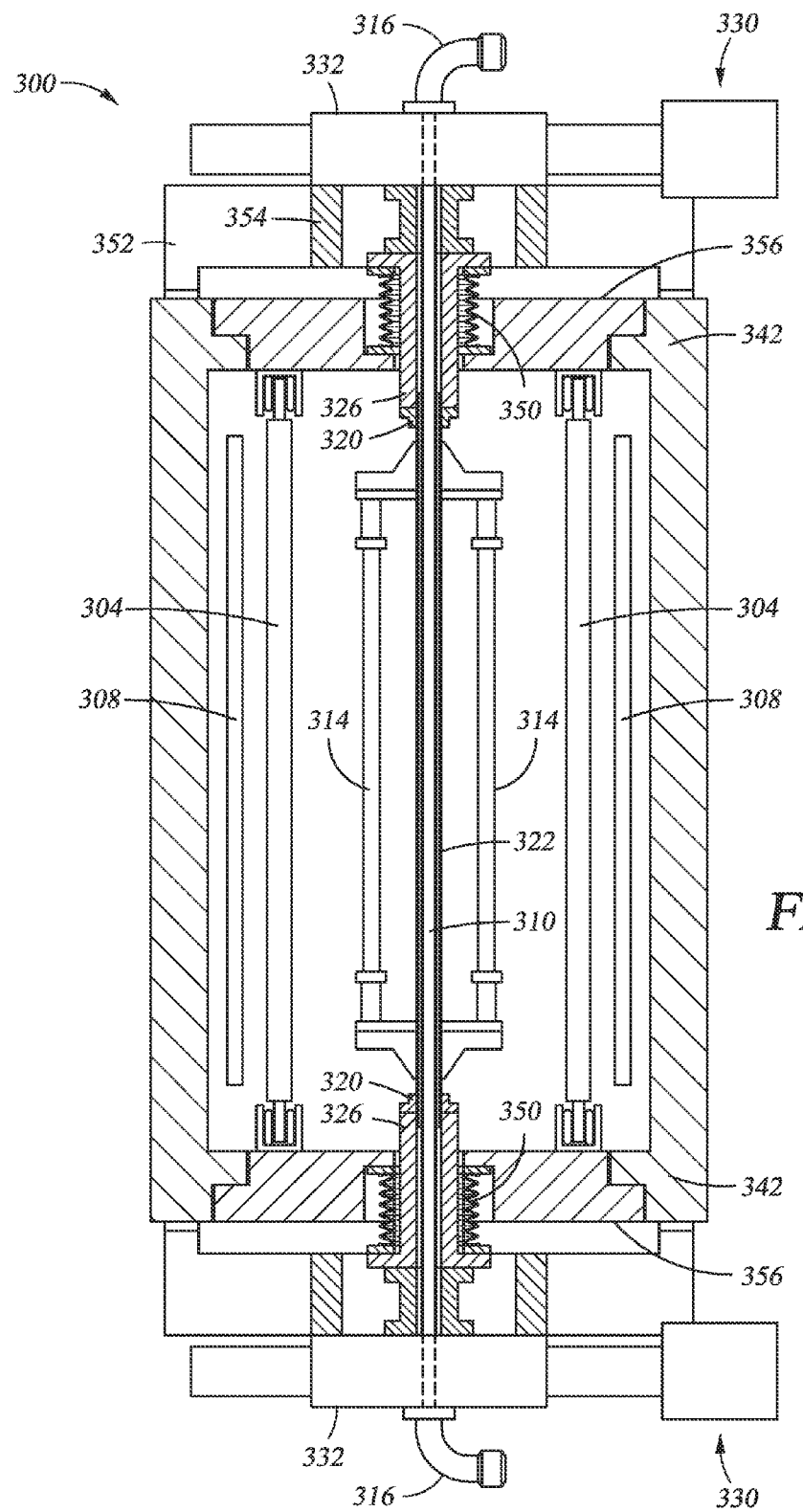
FIG. 3B is a schematic cross-sectional view of a dual processing chamber 300 according to one embodiment.

FIG. 3B is a schematic cross-sectional view of a dual processing chamber 300 according to one embodiment. The dual processing chamber 300 includes shadow frames 304, platens 308, a plurality of antennas 310, a plurality of gas introduction tubes 314, microwave launcher assemblies 330, bellows 350, support frameworks 352, and chamber lids 356. Each microwave launcher assembly 330 includes a microwave power head 332, a feed through 326, and an end cap 320. A plurality of fittings 316 are in fluid connection with the ends of each antenna 310.

Each microwave launcher assembly 330 is coupled to and supported by a support framework 352. The support frameworks 352 are coupled to a top portion of the processing chamber 342 and a bottom portion of the processing chamber 344 on either side of the chamber lids 356. Each of the plurality of antennas 310 extends vertically from a top of the processing chamber 342 to a bottom of the processing chamber 344. An upper end of each antenna 310 extends through a microwave launcher assembly 330 coupled to a support framework 352, and a lower end of each antenna 310 extends through a microwave launcher assembly 330 coupled to a support framework 352. A center portion of each antenna 310 extends vertically between each feed through 326 of the microwave launcher assemblies 330.

Figure 3C:
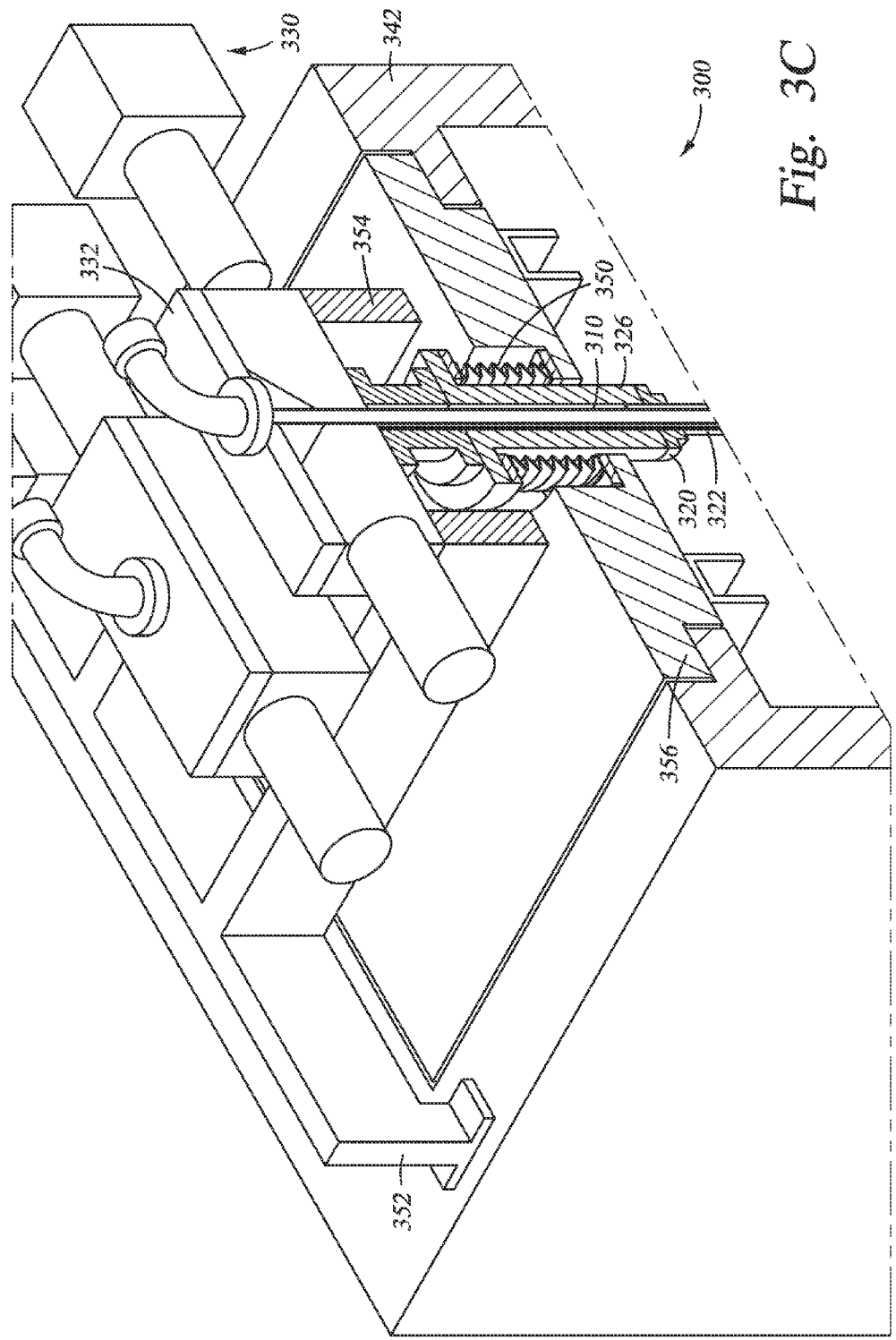
FIG. 3C is a schematic cross-sectional perspective view of an upper portion of a dual-processing chamber 300 according to one embodiment.

FIG. 3C is a schematic cross-sectional view of an upper portion of a dual-processing chamber 300 according to one embodiment. The dual processing chamber 300 includes a plurality of antennas 310, a plurality of microwave launcher assemblies 330, bellows 350, a support framework 352, and a chamber lid 356. Each microwave launcher assembly 330 includes a microwave power head 332, a feed through 326, and an end cap 320.

Figure 4A:
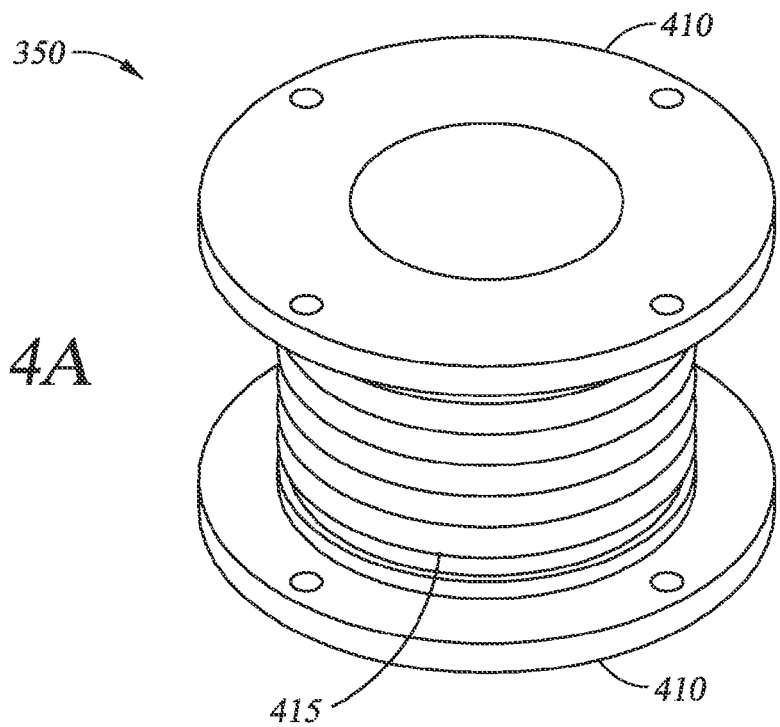
FIG. 4A is a schematic perspective view of a bellows 350 according to one embodiment.

FIG. 4A is a schematic perspective view of a bellows 350 according to one embodiment. The bellows 350 includes flanges 410 and a center portion 415. The flanges 410 may be circular and may include a first flange and a second flange, such as an upper flange and a lower flange. The design of the bellows 350 includes a flexible, cylindrical center portion 415 which is capable of expanding or contracting in response to tensile or compressive forces between the outer flanges. Additionally, the flexibility of the center portion 415 may permit shear forces to provide lateral movement between the outer flanges, for instance, if the lower flange is deflected to the right or left with respect to the upper flange.

During substrate processing, the chamber walls may undergo repeated vacuum and/or thermal deformation. Consequently, the bellows 350 should be composed of a high-strength, flexible material which is capable of undergoing cyclic loading and thermal cycling without fatiguing and breaking. For example, the bellows 350 may be composed of a high-strength metal alloy such as Haynes® 242® Alloy (Haynes International, Inc., Kokomo, Ind.) or AM 350™ Alloy (ATI Allegheny Ludlum Corporation, Brackenridge, Pa.). In another embodiment, the bellows 350 includes a metal alloy having a nickel content of at least 50 percent by weight. The use of other alloys which exhibit long fatigue lives is also within the scope of the application.

Figure 4B:
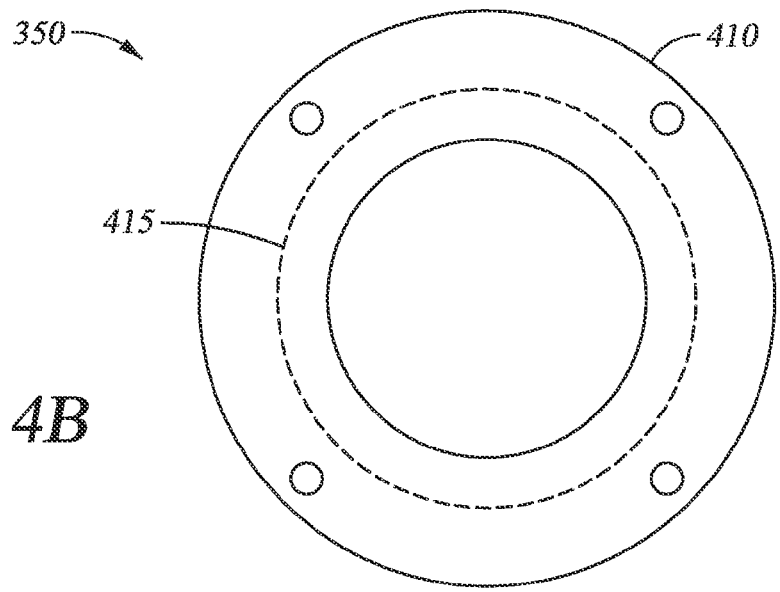
FIG. 4B is a schematic plan view of a bellows 350 according to one embodiment.

FIG. 4B is a schematic plan view of a bellows 350 according to one embodiment. The bellow includes flanges 410 and a center portion 415. The cylindrical center portion 415 of the bellows 350 may have an inner diameter of about 3 inches to 12 inches. For example, the inner diameter may be about 4 inches to 6 inches. The circular flanges 410 of the bellows 350 may have an outer diameter of about 6 inches to 18 inches. For example, the outer diameter may be about 8 inches to 12 inches.

While the foregoing is directed to embodiments of the present invention, other and further embodiments of the invention may be devised without departing from the basic scope thereof, and the scope thereof is determined by the claims that follow.

The invention claimed is:

1. An apparatus, comprising:
a chamber body having a chamber lid;
a feed through extending through the chamber lid;
an antenna coupled to and extending through the feed through to an internal volume of the chamber body; and
a bellows comprising:
a first flange, the first flange coupled to the feed through;
a second flange, the second flange coupled to the chamber lid; and
a center portion extending between the first flange and the second flange.

2. The apparatus of claim 1, wherein the feed through is not coupled directly to the chamber lid.

3. The apparatus of claim 1, wherein the bellows forms a vacuum seal between the feed through and the chamber lid.

4. The apparatus of claim 1, wherein the center portion comprises a flexible region adapted to expand in response a tensile force between the first and second flanges and contract in response to a compressive force between the first and second flanges.

5. The apparatus of claim 1, further comprising a dielectric layer disposed around the antenna, wherein the dielectric layer is coupled to the feed through.

6. The apparatus of claim 5, wherein the dielectric layer forms a vacuum seal with the feed through.

7. The apparatus of claim 5, further comprising an end cap coupled to the feed through, the end cap forming a vacuum seal with the feed through and the dielectric layer.

8. The apparatus of claim 1, further comprising:
a support framework coupled to the chamber body; and
a microwave power head coupled to the support framework, the feed through being coupled to the microwave power head.

9. The apparatus of claim 8, wherein the support framework is not coupled directly to the chamber lid.

10. The apparatus of claim 9, wherein at least one end of the support framework forms a sliding connection with the chamber body.

11. The apparatus of claim 1, wherein the bellows comprises a metal alloy.

12. The apparatus of claim 1, wherein the bellows is disposed in a recess formed in the chamber lid.

13. An apparatus, comprising:
a chamber body having a chamber lid;
a feed through extending through the chamber lid, the feed through not being coupled directly to the chamber lid;
an antenna coupled to and extending through the feed through to an internal volume of the chamber body; and
a bellows forming a vacuum seal between the feed through and the chamber lid, the bellows comprising:
a first flange, the first flange coupled to the feed through;
a second flange, the second flange coupled to the chamber lid; and
a center portion comprising a flexible region, the center portion extending between the first flange and the second flange.

14. A method for isolating an antenna, comprising:
providing a chamber body having a chamber lid;
coupling a bellows to the chamber body;
coupling a feed through to the bellows;
disposing an antenna in the feed through; and
evacuating the chamber body to form a vacuum condition in the chamber, wherein the chamber lid undergoes a deflection in response to the evacuating, and the bellows reduces the degree to which the deflection of the chamber lid is translated to the feed through and the antenna.

15. The method of claim 14, wherein the feed through is not coupled directly to the chamber lid.

16. The method of claim 14, wherein the bellows comprises a center portion having a flexible region adapted to expand in response a tensile force between a first flange and a second flange of the bellows and contract in response to a compressive force between the first flange and the second flange of the bellows.

17. The method of claim 14, further comprising forming a vacuum seal between the chamber lid and the feed through with the bellows.

18. The method of claim 14, further comprising coupling the feed through to a dielectric layer disposed around the antenna.

19. The method of claim 14, wherein the coupling comprises forming a vacuum seal between the bellows and the chamber lid and forming a vacuum seal between the feed through and the bellows.

20. The method of claim 14, wherein the bellows comprises a metal alloy.

* * * * *